United States Patent
Kunishima

[11] Patent Number: 6,037,999
[45] Date of Patent: Mar. 14, 2000

[54] TUNER FOR RECEIVING TELEVISION SIGNAL

[75] Inventor: Tsutomu Kunishima, Miyagi-ken, Japan

[73] Assignee: Alps Electric Co., Ltd., Tokyo, Japan

[21] Appl. No.: 09/044,204

[22] Filed: Mar. 17, 1998

[30] Foreign Application Priority Data

Mar. 27, 1997 [JP] Japan ................................. 9-076061

[51] Int. Cl.⁷ .............................. H04B 1/06; H04N 5/52; H04N 5/50
[52] U.S. Cl. ................. 348/731; 455/240.1; 455/241.1; 455/245.1; 455/249.1; 455/247.1; 455/253.1; 348/731; 348/678
[58] Field of Search ..................... 348/731, 678; 455/240.1, 241.1, 245.2, 249.1, 253.1, 247.1, 177.1, 200.1, 310, 311, 250.1, 245.1, 246.1

[56] References Cited

U.S. PATENT DOCUMENTS

| | | | |
|---|---|---|---|
| 4,019,160 | 4/1977 | Kam . | |
| 4,147,991 | 4/1979 | Ijichi et al. | 330/284 |
| 4,172,239 | 10/1979 | Harford | 330/298 |
| 4,403,346 | 9/1983 | Ogawa . | |
| 4,520,507 | 5/1985 | Moon | 455/3 |
| 4,580,288 | 4/1986 | Rinderle | 455/239 |
| 5,369,792 | 11/1994 | Matsumoto et al. | 455/245.1 |
| 5,465,408 | 11/1995 | Sugayama et al. | 455/249.1 |
| 5,732,342 | 3/1998 | Roth et al. | 455/245.1 |

FOREIGN PATENT DOCUMENTS

| | | |
|---|---|---|
| 0 657 997 A1 | 6/1995 | European Pat. Off. . |
| 08289221 | 11/1996 | Japan . |

*Primary Examiner*—John K. Peng
*Assistant Examiner*—Paulos Natnael
*Attorney, Agent, or Firm*—Brinks Hofer Gilson & Lione

[57] ABSTRACT

A television signal receiving tuner comprises a variable attenuating circuit for attenuating an inputted television signal and outputting the attenuated signal, a preamplifying circuit for amplifying the attenuated signal outputted from the variable attenuating circuit, an input tuning circuit for tuning the amplified television signal outputted from the preamplifying circuit, and a variable gain amplifying circuit for amplifying the tuned television signal outputted from the input tuning circuit.

5 Claims, 2 Drawing Sheets

TUNER FOR RECEIVING TELEVISION SIGNAL

BACKGROUND OF THE INVENTION

1. Field of the Invention

The present invention generally relates to a tuner suitably for receiving a television signal, especially a cable television (hereafter referred to as a CATV) signal.

2. Description of the Related Art

For a CATV receiving tuner, a tuner of double converting is known. The double converting tuner has two mixing circuits and two local oscillating circuits for converting a frequency twice, thereby presenting drawbacks of complicating the mechanical construction and increasing the fabrication cost. Therefore, a single converting tuner has recently come to be used as the CATV receiving tuner.

FIG. 4 is a block diagram illustrating a conventional single converting tuner used for CATV reception. The single converting tuner shown in FIG. 4 has a generally the same constitution as that of a tuner for receiving a general television broadcasting transmitted not by cable but by electromagnetic wave (the television broadcasting of this type is hereafter referred to as ground wave television).

To be more specific, as shown in FIG. 4, in the conventional tuner, an input tuning circuit 31, a high frequency amplifying circuit 32, an interstage tuning circuit 33, and a mixing circuit 34 are sequentially interconnected in a cascade manner. A local oscillating circuit 35 is connected to the mixing circuit 34. A television signal inputted in an input terminal 36 through a cable not shown is mixed by the mixing circuit 34 with an oscillation signal generated by the local oscillating circuit 35 to provide an intermediate frequency, which is outputted from an output terminal 37 as an intermediate frequency signal.

The input tuning circuit 31 has a varactor diode not shown and selects the frequency signal of a desired channel by a tuning control voltage to be supplied to this varactor diode. In addition, in the frequency of a channel to be received, the input tuning circuit 31 matches the impedance of the cable not shown with the input impedance of the high frequency amplifying circuit 32 and inputs the result into the next high frequency amplifying circuit 32.

The high frequency amplifying circuit 32 is a variable gain amplifying circuit and has a control terminal 38 to which an automatic gain control (AGC) voltage from a wave detector not shown is applied. The interstage tuning circuit 33 is constituted by a double tuner in order to largely attenuate signals of channels adjacent to the desired channel at up and down sides thereof.

Because the intermediate frequency to be outputted from the mixing circuit 34 is of a band of several tens MHz (50 MHz in the Japanese standard and 40 MHz in the US standard), the oscillation frequency generated by the local oscillating circuit 35 is away from the frequency of the channel to be received by a frequency equivalent to the intermediate frequency.

In a CATV system, subscribers thereto watch the television for receiving CATV by individually connecting the television to the CATV cable.

If the tuner having the above-mentioned constitution is used for CATV reception, problems that follow are presented. First, television receivers of many subscribers are connected to the CATV cable as a load. Therefore, the input impedance of one television receiver is a part of the signal source impedance for another television receiver. At this moment, the input impedance of another channel receiving another channel, namely the signal source impedance viewed from a certain receiver receiving a particular channel is different from the input impedance of that receiver. Thus, the conventional tuners affect the signal source impedance of each other and provide a mismatch between the signal source impedance and the receiver input impedance, thereby preventing normal reception.

The oscillation signal to be inputted from the local oscillating circuit 35 to the mixing circuit 34 provides a frequency conversion function in the mixing circuit 34 and passes from the interstage tuning circuit 33 to the high frequency amplifying circuit 32 to the input tuning circuit 31. Then, this oscillation signal, because the frequency thereof is close to the frequency of a television signal, cannot be sufficiently attenuated by the interstage tuning circuit 33 and the input tuning circuit, thereby leaking to the CATV cable not shown through the input terminal 36. The leaking oscillation signal is inputted in the tuners of other subscribers, thereby interfering the reception by these tuners.

Further, the high frequency amplifying circuit is arranged in the foremost stage of the tuner, so that the signal to be inputted in the input terminal of the high frequency amplifying circuit is not controlled in intensity and therefore is wide in range and excess in magnitude. This can cause a distortion at the input terminal of the high frequency amplifying circuit, thereby degrading reception quality.

SUMMARY OF THE INVENTION

It is therefore an object of the present invention to provide a television signal receiving tuner that does not inversely affect a signal source impedance, hardly causes a local oscillation signal to leak from an antenna input terminal, and causes no distortion at the input terminal of a high frequency amplifying circuit.

In carrying out the invention and according to one aspect thereof, there is provided a television signal receiving tuner comprising a variable attenuating circuit for attenuating an inputted television signal and outputting the attenuated signal; a preamplifying circuit for amplifying the attenuated signal outputted from the variable attenuating circuit; an input tuning circuit for tuning the amplified television signal outputted from the preamplifying circuit; and a variable gain amplifying circuit for amplifying the tuned television signal outputted from the input tuning circuit.

Preferably, in the television signal receiving tuner, the preamplifying circuit is a wideband amplifying circuit.

Preferably, in the television signal receiving tuner, when a level of the inputted television signal is relatively low, a gain attenuation value of the variable gain amplifying circuit is controlled by an AGC voltage to hold the attenuation value of the variable attenuating circuit at a minimum level and, when the level of the inputted television signal rises, the gain attenuation value of the variable gain amplifying circuit is held at about a predetermined level, thereby controlling the attenuation value of the variable attenuating circuit by the AGC voltage.

Preferably, in the television signal receiving tuner, the variable attenuating circuit is composed of a first PIN diode and a second PIN diode, one end of the first PIN diode is connected to one end of the second PIN diode, an AGC voltage is commonly applied to the one end of the first PIN diode and the one end of the second PIN diode, a bias voltage is applied to another end of the first PIN diode and another bias voltage is applied to another end of the second PIN diode, the first PIN diode and the second PIN diode are current-controlled based on the AGC voltage such that the first PIN diode and the second PIN diode are reverse to each other in change in level of a current; the above-mentioned first PIN diode is connected to a signal path in series and is set with the bias voltage such that a resistance value of the first PIN diode increases relatively quickly over an AGC voltage of a time when the gain attenuation value of the variable gain amplifying circuit reaches the predetermined level; and the above-mentioned second PIN diode is connected to the signal path in parallel and is set with the bias voltage such that a resistance value of the second PIN diode starts decreasing over an AGC voltage of a time when the gain attenuation value of the variable gain amplifying circuit reaches the predetermined level.

Preferably, in the television signal receiving tuner, a third diode is provided applied with an AGC voltage at an anode thereof and a bias voltage at a cathode thereof, a gain control voltage for controlling a gain of the variable gain amplifying circuit is derived from the cathode, and the bias voltage is set to a voltage approximately equal to an AGC voltage of a time when the gain attenuation value of the variable gain amplifying circuit reaches the predetermined level.

Preferably, in the television signal receiving tuner, the bias voltage to be applied to the first PIN diode is set a level lower than the AGC voltage of a time when the gain attenuation value of the variable gain amplifying circuit reaches the predetermined level and the bias voltage to be applied to the second PIN diode is set to a level approximately equal to the AGC voltage of a time at which the gain attenuation value of the variable gain amplifying circuit reaches the predetermined level.

BRIEF DESCRIPTION OF THE DRAWINGS

These and other objects of the invention will be seen by reference to the description, taken in connection with the accompanying drawing, in which.

DETAILED DESCRIPTION OF PREFERRED EMBODIMENT

Figure 1:
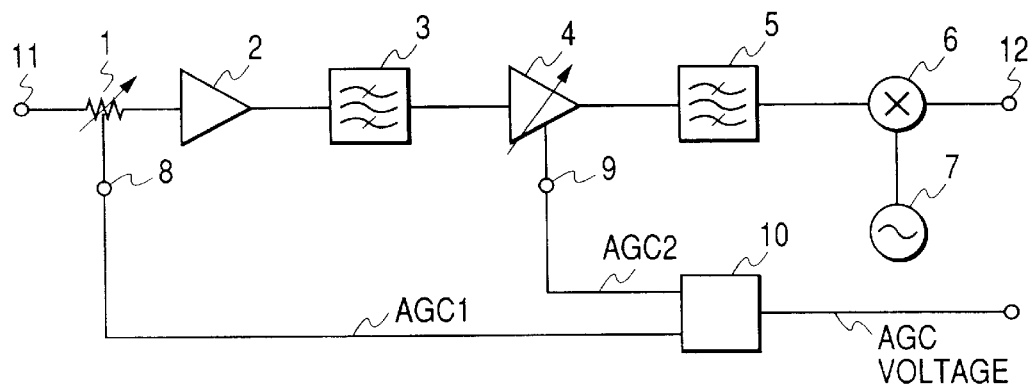
FIG. 1 is a block diagram illustrating a television signal receiving tuner practiced as one preferred embodiment of the invention.

A television signal receiving tuner (hereafter simply referred to as a tuner) according to the invention will be described with reference to FIGS. 1 through 3. Now, referring to FIG. 1, the tuner comprises a variable attenuating circuit 1, a preamplifying circuit 2, an input tuning circuit 3, a variable gain amplifying circuit 4, an interstage tuning circuit 5, and a mixing circuit 6 in a cascade manner. The mixing circuit 6 is also connected to a local oscillating circuit 7. Further, a first control voltage AGC1 and a second control voltage AGC2 that are generated by a control voltage generating circuit 10 based on an AGC voltage supplied from a wave detector not shown to an attenuation control terminal 8 of the variable attenuating circuit 1 and a gain control terminal 9 of the variable gain amplifying circuit 4 respectively.

A CATV signal inputted in an input terminal 11 through a cable not shown is mixed in the mixing circuit 6 with an oscillation signal from the local oscillating circuit 7 to provide an intermediate frequency signal, which is then outputted from an output terminal 12 as an intermediate frequency signal.

This intermediate frequency signal is of 50 MHz band in Japanese standard and 40 MHz band in US standard, so that the oscillation frequency of the local oscillating circuit 7 is higher by 40 to 60 MHz than the frequency of a channel to be received.

In the television signal receiving tuner according to the invention, the variable attenuating circuit 1 and the preamplifying circuit 2 are arranged between the input terminal 11 and the input tuning circuit 3. Therefore, if the oscillation signal from the local oscillating circuit 7 tries to pass reversely to the input terminal 11, the preamplifying circuit 2 suppresses the reverse transmission and the signal level is lowered by the variable attenuating circuit 1. Consequently, the level of the oscillation signal that leaks from the input terminal 11 to the cable not shown can be minimized.

The variable attenuating circuit 1 is constituted by a PIN diode that is current-controlled based on the AGC voltage. As the current to the PIN diode is varied, the equivalent resistance value thereof varies, which varies the attenuation value. The preamplifying circuit 2 is a wideband amplifying circuit that can amplify the television signals of all channels transmitted over the cable not shown. The input impedance of the variable attenuating circuit 1 is set such that the same becomes approximately the characteristic impedance of the cable with the preamplifying circuit 2 connected in the next stage. Also, the input impedance of the preamplifer is set such that the same becomes approximately the characteristic impedance of the cable.

The input tuning circuit 3 has a varactor diode not shown, selects the frequency signal of a desired channel by a tuning control voltage to be supplied to this varactor diode without substantially attenuating this frequency signal, inputs the selected frequency channel into the variable gain amplifying circuit 4, and matches the output impedance of the preamplifying circuit 2 with the input impedance of the variable gain amplifying circuit 4. The variable amplifying circuit 4 is constituted by a dual-gate MOSFET, the second AGC voltage being supplied to a second gate of the variable amplifying circuit 4 connected to a gain control terminal 9 to vary the gain. The interstage tuning circuit 5 is constituted by a double tuner in order to largely attenuate the signal of adjacent channels up and down the desired channel.

Consequently, the input impedance of this tuner at the input terminal 11 is made generally equal by the existence of the variable attenuating circuit 1 and the preamplifying circuit 2 to the cable characteristic also in the channels of the frequency of the channel tuned by the input tuning circuit 3, so that the reception characteristic of the tuners of other subscribers connected to the cable is not degraded.

Figure 2:
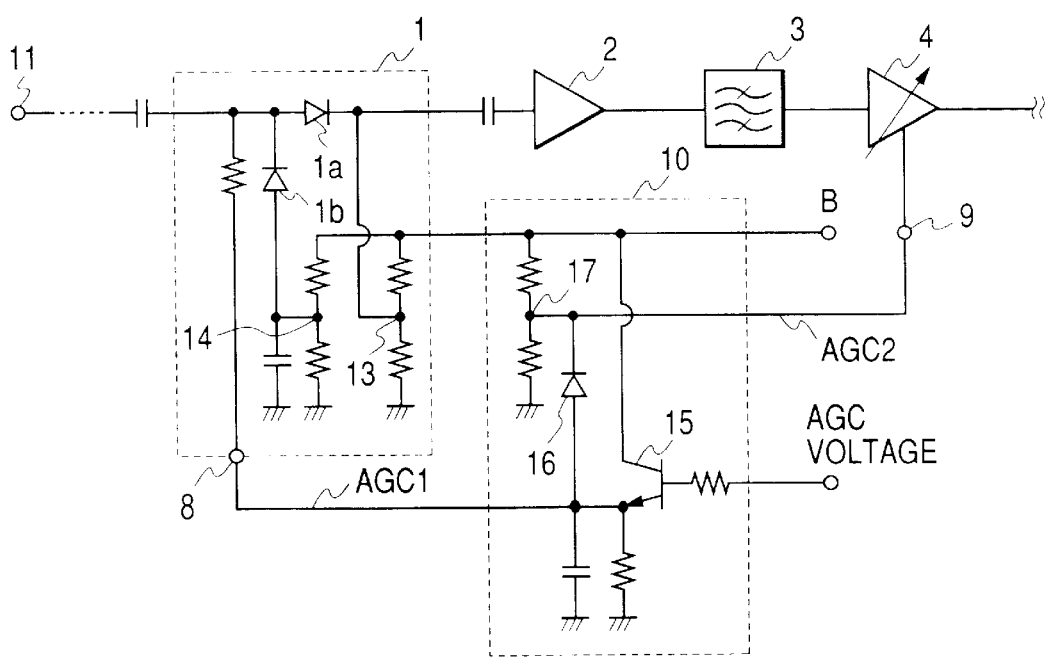
FIG. 2 is a circuit diagram illustrating a control voltage generating circuit associated with the television signal receiving tuner.

The following describes the details of the variable attenuating circuit 1 and the control voltage generating circuit 10 with reference to FIG. 2. The variable attenuating circuit 1 has a first PIN diode 1a arranged on a receive signal transmission path in series therewith and a second PIN diode 1b arranged in parallel to the receive signal transmission path. The anode of the first PIN diode 1a is connected to the cathode of the second PIN diode 1b. To a junction therebetween, a television signal is inputted and, from the cathode of the first PIN diode 1a, the attenuated television signal is taken out. The anode of the second PIN diode 1b is grounded in a high frequency manner.

The cathode of the first PIN diode 1a and the anode of the second PIN diode 1b are supplied with predetermined bias voltages from a first resistance voltage divider 13 and a second resistance voltage divider 14 respectively, thereby performing current-control such that the increase or decrease of the currents in the first PIN diode 1a and the second PIN diode 1b are reversed.

The value of the bias voltage to be applied to the cathode of the first PIN diode 1a is set low enough for the value of the AGC voltage (hereafter referred to as a predetermined AGC value) of the time when the gain attenuation value of the variable gain amplifying circuit 4 reaches a predetermined value as the television signal level increases. The bias voltage value to be applied to the anode of the second PIN diode is set to generally the same level as the predetermined AGC voltage value.

On the other hand, the control voltage generating circuit 10 for generating the first control voltage AGC1 and the second control voltage AGC2 to be supplied to the variable gain amplifying circuit 4 comprises a emitter-follower transistor 15, a diode 16 of which anode being connected to the emitter of this transistor 15, and a third resistance voltage divider 17 for applying a bias voltage to the cathode of this diode 16. An AGC voltage from the wave detector not shown is applied to the base of the transistor 15. From the emitter of the transistor 15, the first control voltage AGC1 is taken to be applied to the attenuation control terminal 8 of the variable attenuating circuit 1. From the cathode of the diode 16, the second control voltage AGC is taken to be applied to the gain control terminal 9 of the variable gain amplifying circuit 4.

The AGC voltage to be applied to the base of the transistor 15 varies between about 6.5 V and 0 V. The 6.5 V is generated in a state in which the level of the received television signal is extremely low and there no AGC is applied. The AGC voltage gets lower as the level of the received television signal rises. It should be noted that the transistor 15 is not always required and therefore may be removed from the constitution. In such a case, the AGC voltage is supplied directly to the anode of the diode 16 and this AGC voltage may provide as the first control voltage AGC. The value of the bias voltage to be applied to the cathode of the diode 16 is set to generally the same level as the above-mentioned predetermined AGC voltage value.

Figure 3:
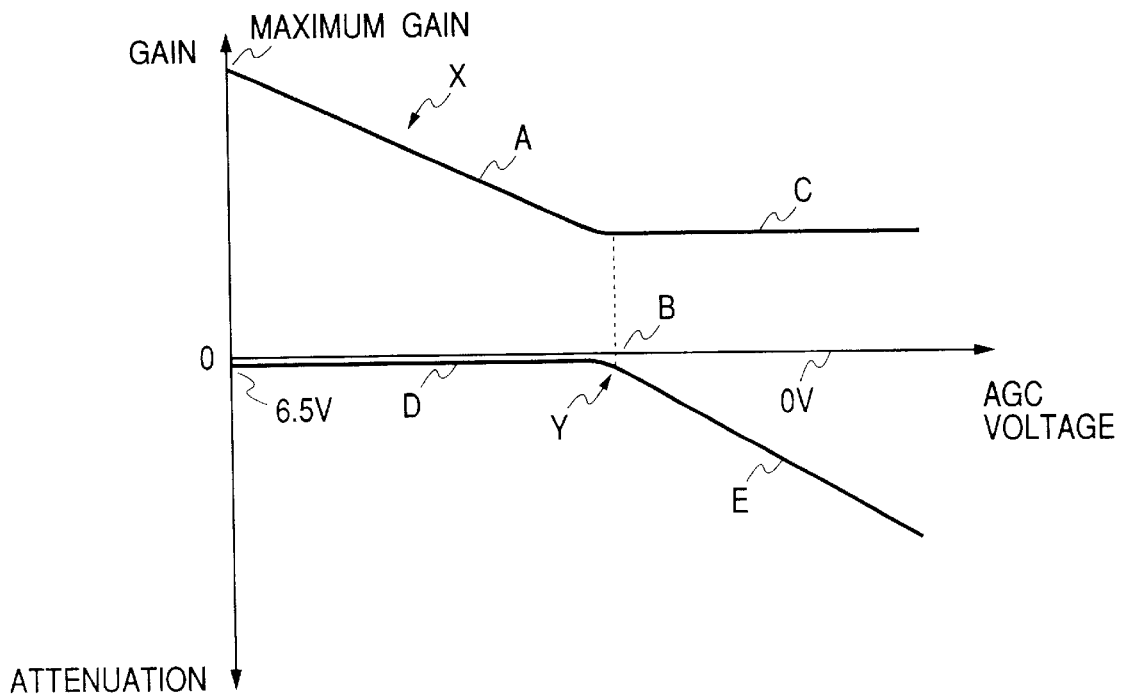
FIG. 3 is a diagram illustrating an AGC characteristic associated with the television signal receiving tuner according to the invention.
Figure 4:
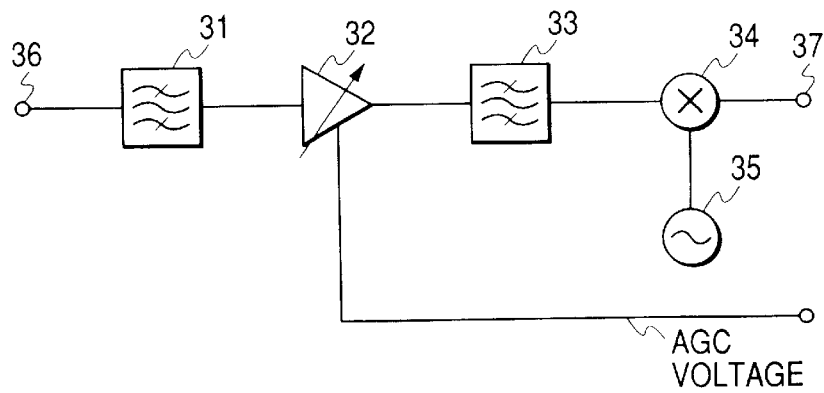
FIG. 4 is a block diagram illustrating a related-art television signal receiving tuner.

The following describes the attenuation characteristic of the variable attenuating circuit 1 and the gain attenuation characteristic of the variable gain amplifying circuit 4 with reference to FIG. 3. A curve X shown in FIG. 3 represents the gain attenuation characteristic for the AGC voltage of the variable gain amplifying circuit 4 and a curve Y represents the attenuation characteristic for the AGC voltage of the variable attenuating circuit 1. First, if a received television signal is low and therefore the AGC voltage is 6.5 V, the collector current and the emitter voltage of the transistor 15 are maximized. By this emitter voltage, a current flows to ground through the diode 6 and the resistance voltage divider 17 and the second control voltage AGC2 of about 5.7 V dropped by the transistor 15 and the diode 16 is supplied to the gain control terminal 9 of the variable gain amplifying circuit 4. At this moment, the variable gain amplifying circuit 4 amplifies the signal at the maximum gain without attenuation as shown in FIG. 3.

If the AGC voltage is 6.5 V, the first control voltage AGC1 from the emitter of the transistor 15 causes a sufficient current to flow to the first resistance voltage divider 13 through the first PIN diode 1a. At this moment, the bias voltage given by the second resistance voltage divider 14 connected to the anode of the second PIN diode 1b is set to a level lower than the emitter voltage of the transistor 15, thereby reversely biasing the second PIN diode 1b to block the current. This causes the first PIN diode 1a to present an extremely small resistance value and the second PIN diode 1b an extremely large resistance value, so that the television signal inputted in the input terminal 11 is inputted in the preamplifying circuit 2 without being attenuated by the variable attenuating circuit 1 as shown in FIG. 3. Therefore, the input impedance of the preamplifying circuit 2 appears as the input impedance at the input terminal of the tuner without change. Consequently, if the input impedance of the preamplifying circuit 2 is set beforehand to generally the same level as the characteristic impedance of the cable not shown, the impedance of the cable matches the impedance of the tuner.

If the level of the inputted television signal rises to drop the AGC voltage lower than 6.5 V, the first control voltage AGC1 and the second control voltage AGC2 drop accordingly. Then, along with the drop of the second control voltage AGC2, the gain of the variable gain amplifying circuit 4 is attenuated (refer to A in FIG. 3). Because the bias voltage supplied to the cathode of the diode 16 is set the value of the AGC voltage (the predetermined AGC voltage value) of the time when the gain attenuation value of the variable gain amplifying circuit 4 reaches the predetermined value as the level of the television signal rises, if the AGC voltage drops below this predetermined AGC voltage value (point B in FIG. 3), the voltage at the cathode of the diode 16 does not decrease below the bias voltage set by the third resistance voltage divider 17, thereby making the second control voltage AGC 2 constant. Consequently, as indicated by portion C in FIG. 3, the gain attenuation value of the variable amplifying circuit 4 is kept at a predetermined value (ATT). It should be noted that this gain attenuation value ATT is preferably at a level about 15 dB attenuated from the maximum gain of the time when the AGC voltage is 6.5 V.

On the other hand, the first control voltage AGC1 drops along with the AGC voltage drop, thereby decreasing the current flowing to the first PIN diode 1a of the variable attenuating circuit 1. Until the AGC voltage drops to the predetermined AGC voltage value B, a sufficient current flows to this first PIN diode 1a and therefore the resistance thereof does not increase. Likewise, until the AGC voltage drops to the predetermined AGC voltage value, the second PIN diode 1b keeps the reverse bias state, so that the resistance value of the second PIN diode 1b is extremely large.

Consequently, until the AGC voltage drops to the predetermined AGC voltage value, the variable attenuating circuit 1 passes the received television signal without attenuation to the preamplifying circuit 2 as indicated at portion D in FIG. 3. In this stage, the resistance value of the first PIN diode 1a is extremely small and the resistance value of the second PIN diode 1b is extremely large, so that the input impedance of the tuner approximately equals the input impedance of the preamplifying circuit 2.

Then, as the level of the television signal rises further, the AGC voltage drops below the predetermined AGC voltage value B, upon which the current flowing to the first PIN diode 1a reduces and its resistance value starts increasing. On the other hand, a current starts flowing to the second PIN diode 1b and its resistance value starts to decrease. This increases the attenuation value of the variable attenuating circuit 1 as indicated at portion E in FIG. 3. Because the resistance value of the second PIN diode 1b decreases along with the increase of the resistance value of the first PIN diode 1a, the input impedance of the variable attenuating circuit 1 varies little, thereby making the input impedance of the tuner at the input terminal 11 substantially constant.

Thus, in the present invention, the preamplifying circuit 2 is arranged in a stage before the variable gain amplifying circuit 4. In the initial stage of the AGC operation to be performed along with the increase of the level of the inputted television signal, gain control of only the variable gain amplifying circuit 4 is performed and attenuation control of the variable attenuating circuit 1 arranged before the preamplifying circuit 2 is not performed. Consequently, a good noise factor (NF) can be maintained.

Further, at the stage in which the AGC voltage has changed to the predetermined AGC voltage value B along with the increase in the level of the inputted television signal, gain control of the variable gain amplifying circuit 4 is stopped and the attenuation of the variable attenuating circuit 1 is started. Consequently, no large television signal is inputted in the variable gain amplifying circuit 4, thereby decreasing the distortion caused in the preamplifying circuit 2. Moreover, because gain control of the variable gain amplifying circuit 4 is not performed, a second gate voltage of the FET of the variable gain amplifying circuit 4 drops no further, the distortion does not increase in the FET amplifying operation.

Still further, the control voltage generating circuit 10 for generating the first control voltage AGC1 and the second control voltage AGC2 from the AGC voltage can be simply constituted by the transistor 15, the diode 16, and the resistance voltage divider 17. Yet further, supplying the divided voltages of the resistor voltage dividers 13 and 14 to the first and second PIN diodes 15 and 16 as bias voltages can easily delay the attenuation control of the variable attenuating circuit 1 behind the gain attenuation control of the variable gain amplifying circuit 4. It should be noted that the transistor 15 may be removed from this constitution as described before.

As described and according to the invention, the television signal receiving tuner has the variable attenuating circuit and the preamplifying circuit in front of the input tuning circuit. Consequently, the oscillation signal outputted from the local oscillating circuit is blocked by the preamplifying circuit and attenuated by the variable attenuating circuit, thereby preventing the oscillation from leaking to the CATV cable.

The television signal receiving tuner according to the invention has the preamplifying circuit that is a wideband amplifying circuit. Therefore, the input impedance is substantially constant over all band of the frequencies of television signals. Besides, the input impedance of the variable attenuating circuit does not vary by received channel, so that the other receivers sharing the cable are not adversely affected.

The television signal receiving tuner according to the invention maintains the attenuation value of the variable attenuating circuit at the minimum level when the level of an inputted television signal is low. Therefore, the NF is not deteriorated. Besides, when the level of the inputted television signal rises, the attenuation value of the variable attenuating circuit is controlled to attenuate an excessively large television signal, thereby decreasing the distortion occurring in the preamplifying circuit and the variable gain amplifying circuit.

The television signal receiving tuner according to the invention maintains the gain attenuation value of the variable gain amplifying circuit substantially at a predetermined value when the level an inputted television signal rises. Therefore, the voltage of the second gate of the FET constituting the variable gain amplifying circuit does not drop largely, thereby decreasing the distortion occurring in the variable gain amplifying circuit.

The television signal receiving tuner according to the invention applies bias voltages to the first and second PIN diodes. Therefore, setting can be made easily with a simple constitution such that, over the AGC voltage of the time at which the gain attenuation value of the variable amplifying circuit reaches the above-mentioned predetermined value, the resistance value starts increasing or decreasing.

The television signal receiving tuner according to the invention has the third diode with its anode applied with an AGC voltage and its cathode applied with a bias voltage. From this cathode, the gain control voltage for controlling the gain of the variable gain amplifying circuit is derived. Therefore, the gain attenuation value can be limited from increasing above the predetermined value by a simple constitution.

In the television signal receiving tuner according to the invention, the bias voltage to be applied to the first PIN diode is set a level lower than the AGC voltage of a time when the gain attenuation value of the variable gain amplifying circuit reaches the predetermined level and the bias voltage to be applied to the second PIN diode is set to a level approximately equal to the AGC voltage of a time at which the gain attenuation value of the variable gain amplifying circuit reaches the predetermined level. Therefore, simply setting only the bias voltage can easily set the resistance increase start point of the first PIN diode and the resistance decrease start point of the second PIN diode.

While the preferred embodiment of the present invention has been described using specific terms, such description is for illustrative purposes only, and it is to be understood that changes and variations may be made without departing from the spirit or scope of the appended claims.

What is claimed is:

1. A television signal receiving tuner comprising:
   a variable attenuating circuit for attenuating an inputted television signal and outputting the attenuated signal;
   a preamplifying circuit for amplifying said attenuated signal outputted from said variable attenuating circuit;
   an input tuning circuit for tuning the amplified television signal outputted from said preamplifying circuit; and
   a variable gain amplifying circuit for amplifying the tuned television signal outputted from said input tuning circuit;
   wherein said preamplifying circuit is a wideband amplifying circuit.

2. A television signal receiving tuner according to claim 1, wherein a gain attenuation value of said variable gain amplifying circuit is controlled by an automatic gain control voltage to hold the attenuation value of said variable attenuating circuit at a minimum level when a level of said inputted television signal is relatively low, and said gain attenuation value of said variable gain amplifying circuit is held at about a predetermined level when the level of said inputted television signal rises, thereby controlling said attenuation value of said variable attenuating circuit by said automatic gain control voltage.

3. A television signal receiving tuner according to claim 2, wherein said variable attenuating circuit comprises a first PIN diode and a second PIN diode, one end of said first PIN diode is connected to one end of said second PIN diode, an automatic gain control voltage is commonly applied to said one end of said first PIN diode and said one end of said second PIN diode, a bias voltage is applied to another end of said first PIN diode and another bias voltage is applied to another end of said second PIN diode, said first PIN diode and said second PIN diode are current-controlled based on said automatic gain control voltage such that said first PIN diode and said second PIN diode are reverse to each other in change in level of a current;

said first PIN diode is connected to a signal path in series and is set with said bias voltage such that a resistance value of said first PIN diode increases relatively quickly over an automatic gain control voltage of a time when the gain attenuation value of said variable gain amplifying circuit reaches said predetermined level; and said second PIN diode is connected to the signal path in parallel and is set with said bias voltage such that a resistance value of said second PIN diode starts decreasing over an automatic gain control voltage of a time when the gain attenuation value of said variable gain amplifying circuit reaches said predetermined level.

4. A television signal receiving tuner according to claim 3, wherein a third diode is provided applied with an automatic gain control voltage at an anode thereof and a bias voltage at a cathode thereof, a gain control voltage for controlling a gain of said variable gain amplifying circuit is derived from said cathode, and said bias voltage is set to a voltage approximately equal to an automatic gain control voltage of a time when the gain attenuation value of said variable gain amplifying circuit reaches said predetermined level.

5. A television signal receiving tuner according to claim 3, wherein said bias voltage to be applied to said first PIN diode is set a level lower than the automatic gain control voltage of a time when the gain attenuation value of said variable gain amplifying circuit reaches said predetermined level and said bias voltage to be applied to said second PIN diode is set to a level approximately equal to the automatic gain control voltage of a time when the gain attenuation value of said variable gain amplifying circuit reaches said predetermined level.

* * * * *